United States Patent [19]

Vackier et al.

[11] Patent Number: 5,572,273
[45] Date of Patent: Nov. 5, 1996

[54] APPARATUS AND METHOD FOR MAKING A LITHOGRAPHIC OFFSET PLATE BY THE SILVER SALT DIFFUSION TRANSFER PROCESS

[75] Inventors: Leo Vackier, 's-Gravenwezel; Bart Verhoest, Wilrijk; Jan Claes, Mortsel, all of Belgium

[73] Assignee: Agfa-Gevaert N.V., Mortsel, Belgium

[21] Appl. No.: 407,293

[22] Filed: Mar. 20, 1995

[30] Foreign Application Priority Data

Mar. 25, 1994 [EP] European Pat. Off. .............. 94200812

[51] Int. Cl.$^6$ ....................................... G03D 3/02
[52] U.S. Cl. .......................... 396/630; 396/612; 396/624; 396/604
[58] Field of Search ...................................... 354/313, 317, 354/319–325; 430/398–400; 134/64 P, 64 R, 122 P, 122 R

[56] References Cited

U.S. PATENT DOCUMENTS 4,987,438   1/1991   Goto et al. ............................... 354/319

FOREIGN PATENT DOCUMENTS 5-93997   4/1993   Japan ..................................... 354/325

*Primary Examiner*—D. Rutledge
*Attorney, Agent, or Firm*—Brumbaugh, Graves, Donohue & Raymond

[57] ABSTRACT

Provided is an apparatus for processing a photographic sheet (9) which comprises at least one station (4) with inlet and outlet pressure roller pairs (42 to 45) for transporting the sheet, spray means (22) for spraying processing liquid (21) onto at least one surface of the sheet, characterised in that the station (4) comprises sealing means for maintaining a liquid seal (58, 59) between at least one roller of at least one roller pair and an adjacent wall of the washing station. Also provided is an apparatus for making an offset printing plate according to the silver salt diffusion transfer process, using the described station (4) as washing station. Also provided is a method for making an offset printing plate using the above described apparatus for processing an imaging element.

7 Claims, 4 Drawing Sheets

APPARATUS AND METHOD FOR MAKING A LITHOGRAPHIC OFFSET PLATE BY THE SILVER SALT DIFFUSION TRANSFER PROCESS

FIELD OF THE INVENTION

The present invention relates to an apparatus and a method for the processing of photographic sheet materials and particularly for developing such materials that are suitable to produce by the silver salt diffusion transfer process a lithographic offset printing plate.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a socalled silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image receiving layer of a sheet or web material which is a separate element with respect to the photographic silver halide emulsion (a socalled two-sheet DTR element) or in the image receiving layer of a socalled single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the monosheet DTR imaging elements exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After informationwise exposure and development the imaging element is used as a printing plate without the removal of the emulsion layer.

According to a second type of monosheet DTR imaging element a hydrophilic support, mostly anodized aluminium, is provided in the order given with a layer containing physical development nuclei and a silver halide emulsion layer. Such type of lithographic printing plate is disclosed e.g. in U.S. Pat. No. 3,511,656. The lithographic plate is obtained by the following steps:
(a) imagewise exposing an imaging element comprising in the order given (i) a hydrophilic base, (ii) an image receiving layer containing physical development nuclei and (iii) a photosensitive layer containing a silver halide emulsion being in water permeable relationship with said image receiving layer,
(b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse imagewise from the photosensitive layer to said image receiving layer to produce therein a silver image,
(c) treating the imaging element with water to remove the layer(s) on top of said image receiving layer, thereby uncovering said silver image formed in said image receiving layer.

However, during the transfer between consecutive processing stations, the imaging element risks causing contamination of the solutions which would result in unwanted side effects. First, if any washing fluid or washsolution should pass to the diffusion transfer zone, the quality of the developed imaging element would not be equal over all places.

To avoid a significant part of these contamination problems, it is common practice to pass the imaging element between squeegee rollers. In order to further reduce such contamination problems, it has been described in Research Disclosure 15609, April 1977, to additionally apply flexible seals, made for example from commercially available extruded weather stripping material.

OBJECTS OF THE INVENTION

It is an object of the present invention to provide an improved apparatus for processing a photographic sheet.

It is a further object of the present invention to provide an alternative apparatus for obtaining lithographic offset printing plates according to the DTR-process with improved printing properties.

It is a still further object of the present invention to provide an alternative method for obtaining lithographic offset printing plates according to the DTR-process with improved printing properties.

Further objects and advantages will become apparant from the description given hereinbelow.

SUMMARY OF THE INVENTION

According to the present invention, there is provided an apparatus for processing a photographic sheet which comprises at least one station with inlet and outlet pressure roller pairs for transporting said sheet through the station, spray means for spraying processing liquid onto at least one surface of said sheet while in the station, characterised in that said station comprises sealing means for maintaining a liquid seal between at least one roller of at least one roller pair and an adjacent wall of the washing station.

According to the present invention, there is also provided an apparatus for processing an imaging element comprising in the order given (i) a hydrophilic base, (ii) an image receiving layer containing physical development nuclei and (iii) a silver halide emulsion layer to form a lithographic offset plate, the said apparatus comprising a developing station, a diffusion transfer station, a washing station, a rinsing station and a finishing station characterized in that the washing station comprises at least one pair of liquid seals which are formed between walls of the washing station and the peripheral surface of at least one pair of transport rollers.

The present invention also provides a method for making an offset printing plate using the above described apparatus for processing an imaging element.

BRIEF DESCRIPTION OF THE DRAWINGS

The present invention will be illustrated by means of the following drawings, without however the intention to limit the invention thereto.

FIG. 5 is a detailed view of a liquid seal according to the present invention;

DETAILED DESCRIPTION OF THE INVENTION

EP-A-410500 discloses an imaging element containing in the order given a support provided with an image receiving layer and a silver halide emulsion. In said document is disclosed a diffusion transfer reversal process (also called "DTR process") for obtaining a lithographic printing plate (further commonly indicated as "printing plate" or shortly "plate") in which said imaging element is imagewise exposed and subsequently developed using a developing liquid or activating liquid in the presence of a silver halide complexing agent. The imaging element is then guided through a diffusion transfer zone so that the silver halide complexes formed during the development step are allowed to diffuse into the image receiving layer where they are converted to silver. When the imaging element leaves the diffusion transfer zone a silver image has been formed in the image receiving layer. Hereafter, the imaging element passes a washing and a rinsing station to remove the silver halide emulsion layer so that the silver image becomes exposed. Finally the imaging element, now carrying a silver image in the silver receiving layer, is treated with a finishing liquid that contains a so called hydrophobizing agent for improving the hydrophobicity of the silver image.

Figure 1:
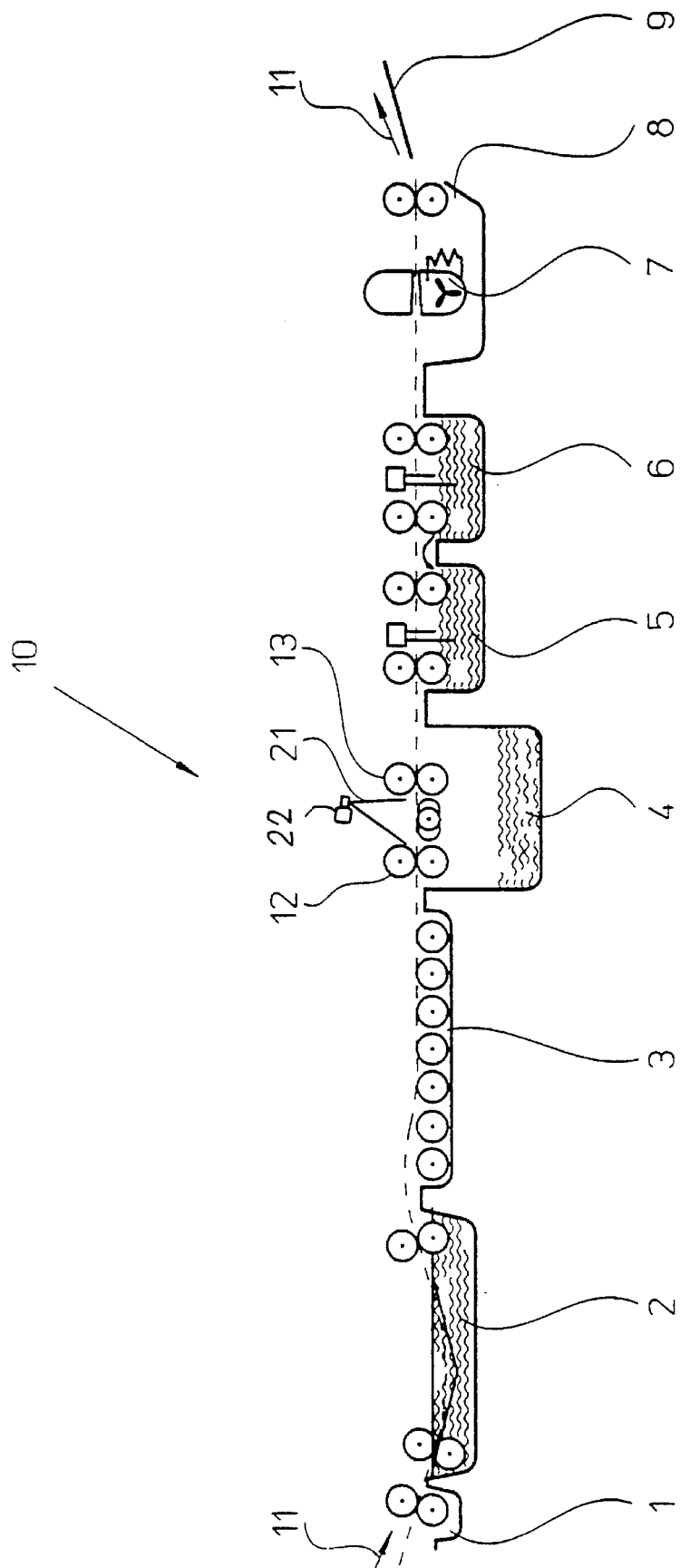
FIG. 1 is a schematic layout of a processing apparatus according to the present invention.

Reference is firstly made to FIG. 1 in which there is illustrated a longitudinal cross section through an apparatus 10 for processing exposed imaging elements of the type described in EP-A-410500. The apparatus 10 is mounted within a generally rectangular housing (not shown) for supporting the various parts of the apparatus. An informationwise exposed imaging element 9 is progressing along a processing path or processing direction 11 by being sequentially fed through an entrance station 1, a developing station 2 containing an aqueous alkaline solution with (a) developing agent(s) and (a) silver halide solvent(s) to form a silver image in said photosensitive layer, a diffusion transfer station 3 to allow unreduced silver halide or complexes formed thereof to diffuse imagewise from the photosensitive layer to the image receiving layer to produce therein a silver image, a washing station 4 for treating the imaging element with water to detach the layer(s) on top of said image receiving layer, a rinsing station 5 to remove the layer(s) on top of said image receiving layer, thereby uncovering said silver image formed in said image receiving layer, and a finishing station 6 for providing a chemical treatment that increases the hydrophilicity of the non-silver image parts and the oleophilicity of the silver image. After having passed a drying station 7, the imaging element may then leave the apparatus 10 through the output station 8 and a lithographic printing plate is obtained.

The development and diffusion transfer are effected with the aid of an aqueous alkaline solution in the presence of (a) developing agent(s) and (a) silver halide solvent(s). The developing agent(s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic base.

The silver halide solvent can also be incorporated at least in part in the image-receiving layer. When the developing solution does not comprise the developing agent(s), it is merely an activating liquid that is capable of dissolving the developing agent(s) contained in one or more of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. However other developing agents can be used.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are alkanolamines, or are thioethers, or are meso-ionic compounds. Preferred meso-ionic compounds for use in accordance with the present invention are triazolium thiolates and more preferably 1,2,4-triazolium-3-thiolates.

Still further suitable silver halide solvents are sulphite, amines, 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857,276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer of the imaging element and to add at least one other silver halide solvent to the developing solution.

According to the present invention for uncovering the imaging element, the developed monosheet layer assemblage is washed with an aqueous medium such as water or water with an additive, so that the now superfluous emulsion layers are removed from the imaging element. According to a particularly preferred embodiment for removing the photosensitive layer(s) and the intermediate layer(s) the imaging element is held under a spray or jet of rinsing water or rinsing aqueous medium. The rinsing aqueous medium used to detach the intermediate layer(s) and the emulsion layer(s)(s) by rinsing may comprise ingredients such as i.a.

weak acidifying agents, wetting agents, and hardeners including latent hardeners.

In washing station 4, the surface of the imaging element is throughput by an entrance pair 12 of rollers and subsequently washed with a solution 21 which is sprayed onto the surface of the imaging element 9 from a washing nozzle 22. Washing station 4 also comprises an exit pair 13 of squeegee rollers for squeezing excessive washsolution from the surface of the imaging element.

Figure 2:
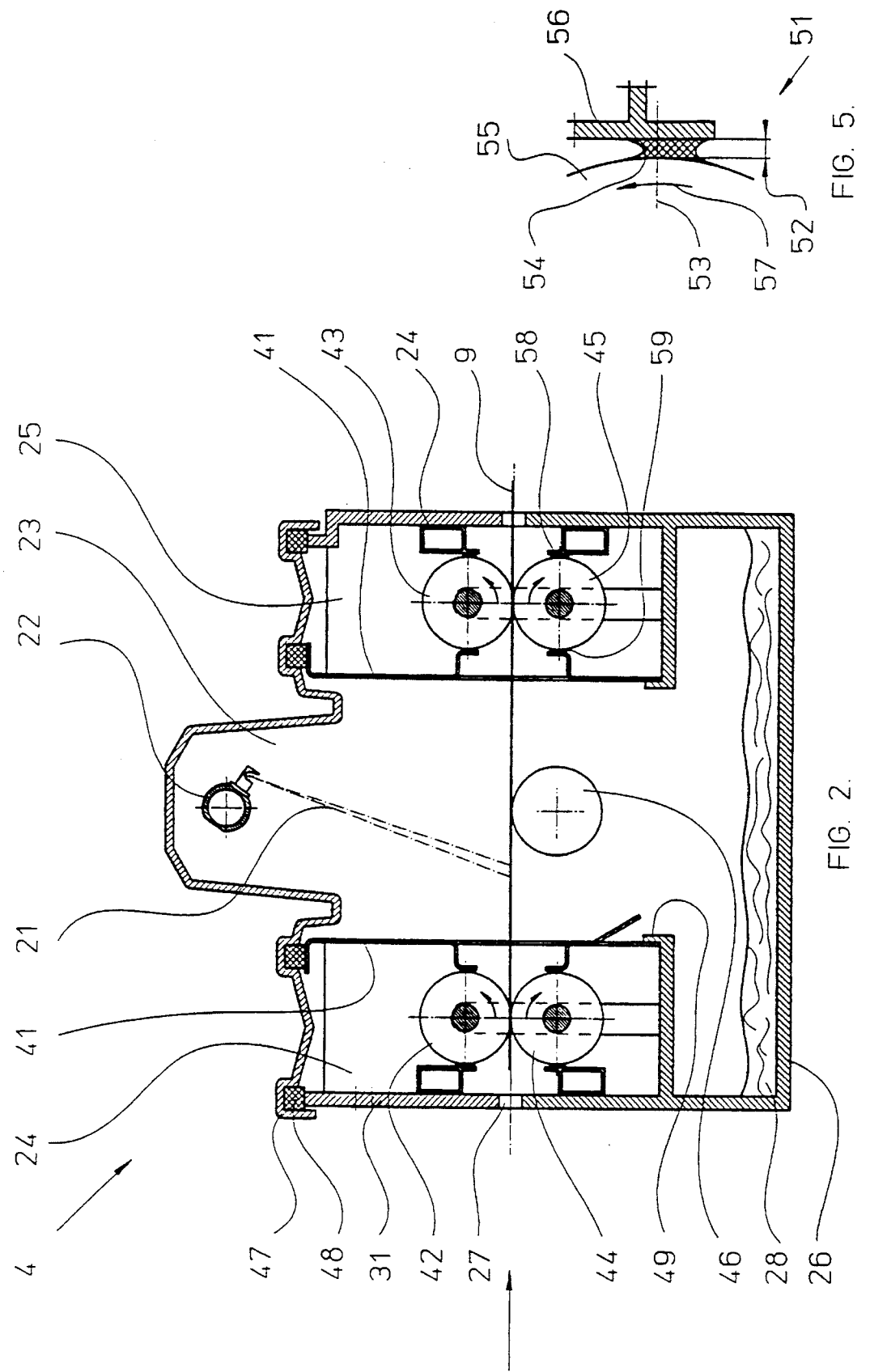
FIG. 2 is a detailed vertical longitudinal cross section through a washing station of an apparatus according to the present invention.
Figure 3:
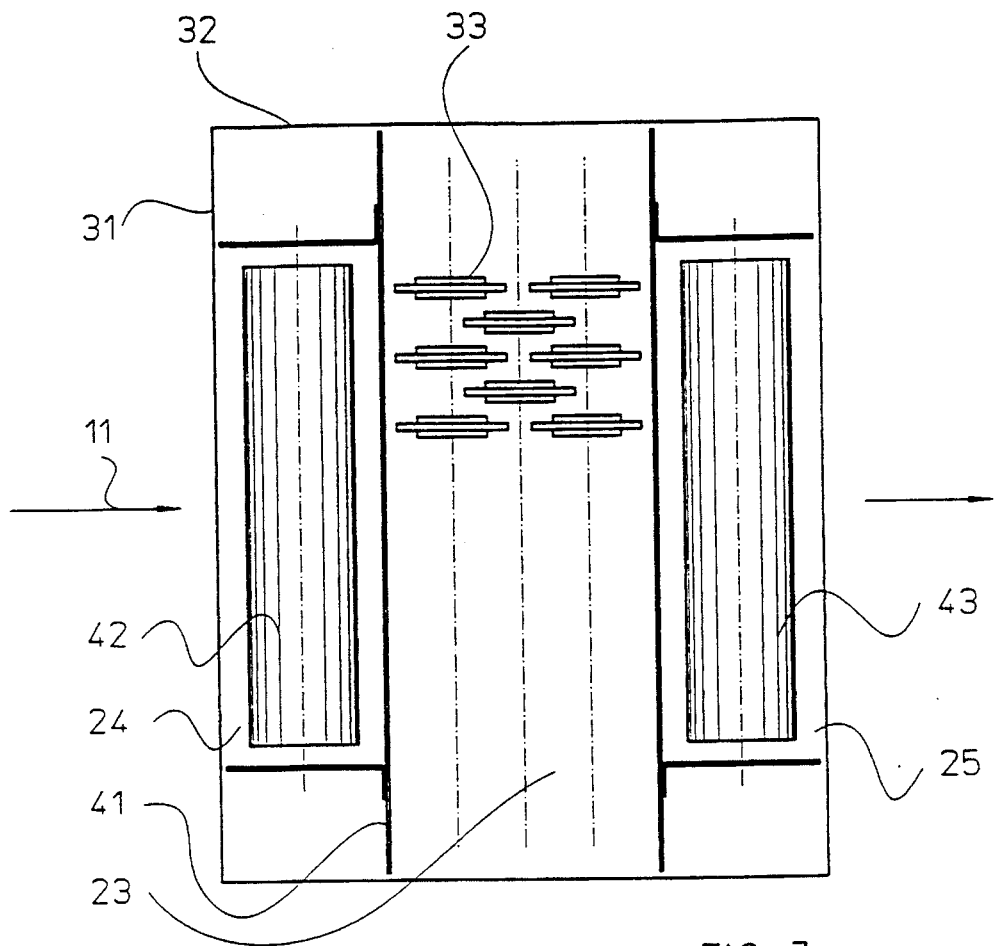
FIG. 3 is a schematic plan view of a washing station of an apparatus according to the present invention.

Now reference is made to FIG. 2, which is a more detailed vertical longitudinal cross section through washing station 4, and to FIG. 3, which is a schematic plan view of washing station 4 according to the present invention. As it can be seen on these figures, the developed imaging element 9 is passing along processing direction 11 under a spray 21 of aqueous medium.

As shown in FIG. 2 and in FIG. 3, washing station 4 essentially comprises a washing or spraying chamber 23 and two antechambers 24 and 25, one at the incoming side of the spraying chamber and one at the outgoing side of the spraying chamber, said antechamber constituted mainly by a specific separation wall 41 (to be described further on). More in detail, washing station 4 further comprises a horizontal bottom 26 and vertical walls 31, 32 with suitable openings 27 for progressing the imaging element 9 into processing direction 11, a sump 28 partly filled with washsolution, rubbered upper rollers 42, 43 and rubbered bottom rollers 44, 45 (mounted within the antechamber 24, 25) for gripping and advancing the imaging element 9, a middle roller 46 or several middle rollers 33 which are possibly segmented middle rollers 36, a cover plate 47 and sealing means 48 to prevent solution leakage and air entrainement, as well as associated pump and temperature control means (not shown).

As a consequence of the preferably very intensive atomisation of the droplets, the air within the washing station 4 has a high concentration of small water droplets. By further consequence, the possible danger of leakages of washsolution liquid to the preceding (diffusion) station 3 or to the following (rinsing) station 5, is also very high. In order to prevent the accompanying contamination problems, which were already described in the introduction given above, preferably three special precautions are taken.

Figure 4:
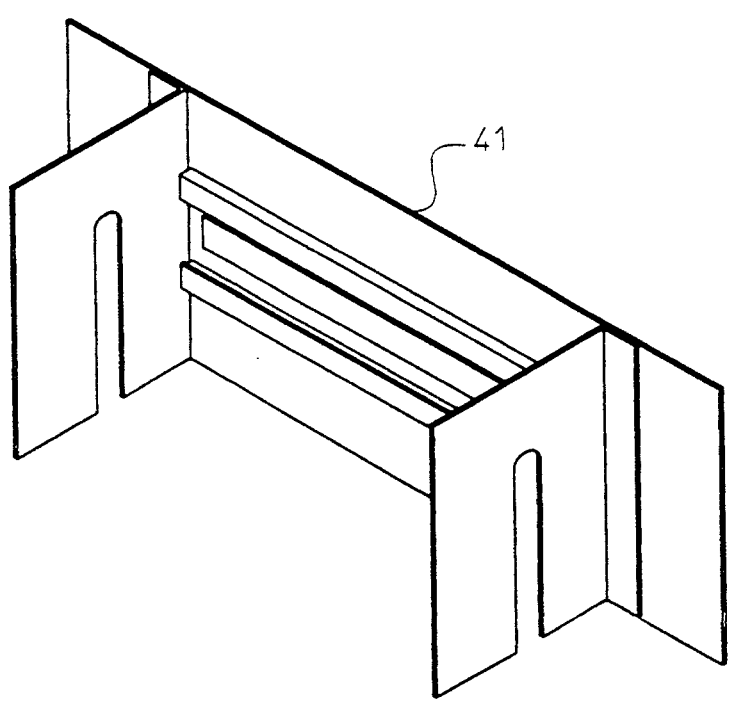
FIG. 4 is a preferred embodiment of a vertical wall of a washing station of an apparatus according to the present invention.

First, nearly no washsolution can leave the washing station 4 in a longitudinal direction 11, because of a suitable separation labyrinth formed by a vertical wall 49 (see FIG. 2) erected from the bottom and a parallel vertical wall 41 (see FIG. 4) descending from the top, which labyrinth represents a high resistance for the flow of atomised droplets. If, despite of the just mentioned labyrinth, some longitudinal leakage might still occur, further progression to a neighbouring station is reduced significantly by the fact that the construction of each antechamber 24, 25 forms itself a second labyrinth, mainly constituted by the pairs 12 and 13 of rollers 42 & 44 and 43 & 45.

Moreover, as a third precaution, liquid seals are formed and maintained between walls of the washing station and transport rollers, best shown in a detail of a liquid seal in FIG. 5.

Figure 6:
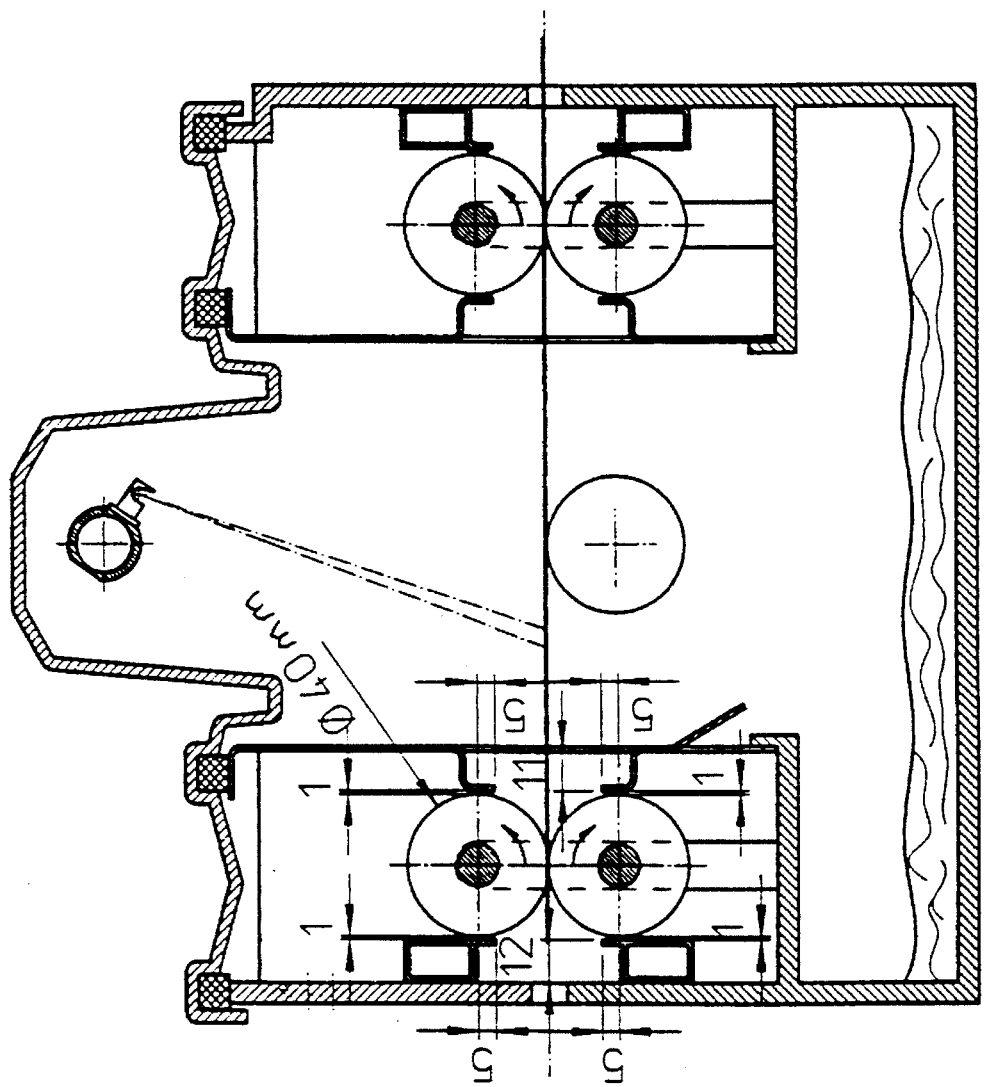
FIG. 6 is a detailed vertical longitudinal cross section through a washing station of an apparatus according to the present invention complemented with some constructional dimensions.

In order to attain a stable sealing meniscus 51, the distance 52 between and the heigth 53 relative to a roller and a corresponding wall are designed within suitable ranges. These ranges are defined by the specification of the washsolution 54, the roller coating 55 and the wall-substance 56 and of the peripheral speed 57 of the rollers. For sake of greater clarity, some practical distances are indicated (in millimetres mm) in FIG. 6.

Furthermore, on each roller, these liquid seals are applied twice, as illustrated by the referrals 58 and 59 (in FIG. 2), namely one at each diametrically opposite side of each roller, thereby further reducing any possible leakage of washsolution.

According to a preferred embodiment of the present invention, the washing spray may start a little time before the imaging element to be washed enters the washing station 4 and the washing spray may stop a little time after the washed imaging element left the washing station 4. Furthermore, even if no imaging element is present in the washing station 4, the washing spray may work (sometimes called "jogging") periodically at some intermediate times.

It is important that the rate of application of the washsolution is controlled within a predetermined range of flow rates being related to the rate of passage of the imaging element through the apparatus 10 and that the temperature and the pressure of the washsolution are maintained accurately at their appropriate levels. E.g. the temperature of the rinsing water may be varied widely but is preferably between 20° C. and 45° C.

The present invention clearly can be applied in the case of processing materials which are suitable to produce a lithographic offset printing plate by the silver salt diffusion transfer process, but can also be applied in the case of processing other photographic sheet materials.

Thus included in the present invention is a suitable automatically operated apparatus for processing lithographic offset printing plates according to a silver complex diffusion transfer reversal process, wherein a washing station is integrated.

Also included in the present invention is an apparatus for processing a photographic sheet which comprises at least one station with inlet and outlet pressure roller pairs for transport of said sheet through the station, spray means for spraying processing liquid onto at least one surface of said sheet while in the station, and roller sealing means for maintaining a liquid seal between at least one roller of at least one roller pair and an adjacent wall of thewashing station, characterised in that said liquid seal is formed by a meniscus of washing liquid which is present between the peripheral surface of said at least one roller and said adjacent wall of the washing station.

We claim:

1. An apparatus for processing a photographic sheet (9) which comprises at least one station (4) with inlet and outlet pressure roller pairs (42 to 45) for transporting said sheet through the station, spray means (22) for spraying processing liquid (21) onto at least one surface of said sheet while in the station, wherein said station includes at least one sealing arrangement between at least one roller of at least one of said roller pairs and an adjacent wall of said station, said sealing arrangement being formed by selection of a spacing between said adjacent wall and an outer surface of said at least one roller to cause said processing liquid to form a continuous meniscus across said spacing.

2. An apparatus according to claim 1, said at least one station further comprising a pair of antechambers, said antechambers each having an outer vertical wall and an inner vertical wall which is substantially parallel to said outer vertical wall, said inner and outer vertical walls each having an opening through which an imaging element may pass and each having a pair of extensions protruding into an interior of said antechamber.

3. An apparatus according to claim 2, said inlet pressure roller pair being located within one of said pair of antechambers, and said outlet pressure roller pair being located within a second of said pair of antechambers.

4. An apparatus according to claim 3, said adjacent wall being one of said pair of extensions of said outer vertical wall.

5. An apparatus according to claim 3, said adjacent wall being one of said pair of extensions of said inner vertical wall.

6. An apparatus according to claim 1, wherein said meniscus is defined by said spacing between and a height relative to said roller and said adjacent wall, by a washsolution, by a roller coating, by a wall substance, and by a peripheral speed of said roller.

7. An apparatus (10) for processing an imaging element (9) comprising in the order given (i) hydrophilic base, (ii) an image receiving layer containing physical development nuclei and (iii) a silver halide emulsion layer to form a lithographic offset plate, said apparatus comprising a developing station (2), a diffusion transfer station (3), a washing station (4), a rinsing station (5) and a finishing station (6), wherein the washing station (4) comprises at least one pair of sealing arrangements between walls of the washing station and at least one pair of transport rollers, each of said sealing arrangements being formed by selection of a spacing between an adjacent one of said walls and a peripheral surface of a roller of said at least one pair of transport rollers to cause a processing liquid to form a continuous meniscus across said spacing.

* * * * *